United States Patent [19]

Tsuchiya et al.

[11] Patent Number: 4,841,182
[45] Date of Patent: Jun. 20, 1989

[54] RECTIFIER IN ALTERNATING GENERATORS FOR AUTOMOTIVE VEHICLES

[75] Inventors: Kyoshi Tsuchiya, Kiryu; Hideyuki Ioka, Maebashi; Hideyuki Takahashi, Ashikaga, all of Japan

[73] Assignee: Mitsuba Electric Mfg., Co., Ltd., Japan

[21] Appl. No.: 89,967

[22] Filed: Aug. 27, 1987

[30] Foreign Application Priority Data

| Aug. 28, 1986 | [JP] | Japan | 61-131811[U] |
| Sep. 1, 1986 | [JP] | Japan | 61-132717[U] |
| Sep. 1, 1986 | [JP] | Japan | 61-132718[U] |
| Jun. 6, 1987 | [JP] | Japan | 62-141712 |

[51] Int. Cl.$^4$ .............................................. H02K 11/00
[52] U.S. Cl. ................... 310/68 D; 310/45; 310/62; 310/64
[58] Field of Search .............. 310/68 D, 89, 68 R, 310/258, 232, 65, 163, 194, 62, 58, 63, 59, 64, 71, 239, 58, 43, DIG. 6, 59, 45; 363/141; 357/81; 361/383, 386, 388; 165/148; 236/34 R, 34.5; 219/343

[56] References Cited

U.S. PATENT DOCUMENTS

| 3,538,362 | 11/1970 | Cheetham | 310/68 D |
| 3,575,632 | 4/1971 | Kato | 361/383 |
| 3,863,127 | 1/1975 | Raver | 310/68 D |
| 3,970,881 | 7/1976 | Sato | 310/68 D |
| 4,284,915 | 8/1981 | Hagenlocher | 310/68 D |
| 4,288,711 | 9/1981 | Hagenlocher | 310/68 D |
| 4,419,597 | 12/1983 | Shiga | 310/64 |
| 4,488,070 | 12/1984 | Iwaki | 310/68 D |
| 4,557,225 | 12/1985 | Sagues | 361/383 |
| 4,606,000 | 8/1986 | Steele | 363/141 |

FOREIGN PATENT DOCUMENTS

| 2656447 | 6/1977 | Fed. Rep. of Germany | 310/68 D |
| 2209733 | 10/1978 | Fed. Rep. of Germany | 310/68 D |
| 2904002 | 8/1979 | Fed. Rep. of Germany | 310/68 D |
| 0125067 | 9/1980 | Japan | 310/68 D |
| 0003560 | 1/1981 | Japan | 310/68 D |

Primary Examiner—R. Skudy
Attorney, Agent, or Firm—Darby & Darby

[57] ABSTRACT

A rectifier in an alternating current generator for automotive vehicles is disclosed, which comprises a pair of conductive radiators for positive and negative sides, each having embedded therein diode chips arranged in a juxtaposed fashion, an insulated substrate facing the radiators and equipped with a terminal board to be connected with each of lead wires from corresponding diode chips, and cooling fins provided on each of the raidators, and a cooling fan provided on a rotor core for cooling the rectifier, the rectifier being positioned in air course in which air for cooling the radiators is introduced into the inside of the generator from the outside of a case bracket of the generator through air intake ports by the action of cooling fan such that radiators are placed in the radial direction in parallel relation to each other in the air course so that the insulating substrate is placed downstream in the air course.

16 Claims, 9 Drawing Sheets

RECTIFIER IN ALTERNATING GENERATORS FOR AUTOMOTIVE VEHICLES

BACKGROUND OF THE INVENTION

1. Field of the Invention

The present invention relates to a rectifier in alternating current generators for automotive vehicles.

2. Description of the Prior Art

Generally, alternating current generators for automotive vehicles such as cars, buses, trucks, motorcycles and the like include a core shaft or rotary shaft, a rotor core such as Lundell type one fitted to the core shaft, a coil bobbin incorporated in the rotor core, a rotor coil wound around the rotor core, a stator, a stator coil wound around the stator, a plurality of brushes, a brush holder, a plurality of slip rings, a rectifier which rectifies generated alternating current into direct current, and a cooling fan provided on the rotor core for cooling the rectifier, the rectifier being positioned in air course in which air for cooling the radiator is introduced into the inside of the generator from the outside of the casing of the generator by the action of the cooling fan.

Since the radiator generates or releases a considerable amount of heat upon rectification it must be cooled as much as possible to improve the efficiency thereof, and for this purpose provision of radiators with cooling fins has been proposed and successful to some extent.

An example of conventional rectifier is of a structure such that a positive-side diode and a negative side diode are attached to a molded substrate both the sides of which are provided with cooling fins so as to project therefrom as described, for example, in Japanese Utility Model Application Laid Open No. Sho-58-75479. However, the conventional construction is disadvantageous in that the efficiency of cooling is unsatisfactory although cooling fins are provided on the substrate. It is difficult to increase the size of the substrate since various electric or electronic devices are used in the automotive vehicle, which reduces the space available for the enlargement of the substrate.

Examples of conventional rectifier including split type radiators are described, for example, in U.S. Pat. Nos. 4,488,070 and 4,419,597. The rectifier described in U.S. Pat. No. 4,488,070 is comprised by a pair of radiators, one for positive side and the other for negative side arranged in parallel relation to each other on the inner and outer diameter sides, having embedded therein a plurality of diodes for positive and negative electrodes, respectively, and provided with cooling fins, with lead wires from the diodes and output side lead wire from a stator coil being soldered to a terminal board or strip embedded in an insulating substrate. This approach has been successful to some extent. However, with view to meeting with recent demands of reducing the weight and volume of the apparatus as well as obtaining a higher output generator, it is now desired strongly to improve the efficiency of cooling the radiators in the rectifier by the employment of larger fins.

Further, diodes which are arranged in a juxtaposed fashion on the radiator tend to stand at different temperatures upon rectification depending on their utility or function in the rectifying circuit and therefore there tends to be observed fluctuation in the distribution of the temperature of the radiator, resulting in that the diodes do not operate in a uniform fashion, thus failing to provide rectifiers having satisfactory reliability.

Conventionally, in rectifiers, positive and negative side radiators are assembled by means of a plurality of bolts so that they can be disposed in superposed relation, with the terminal ends being secured by the bolts to a case bracket of the generator, as shown in FIG. 5. More particularly, one of the radiators, say radiator 16, together with a terminal bar 23 is fixedly engaged with a first bolt 13 in a serration contact at one end thereof and the other end thereof is movably engaged with a second bolt 13' whereas the other radiator 15 is movably engaged with the first bolt 13 at one end thereof and fixedly engaged with the second bolt 13' in a serration contact at the other end thereof. This type of the conventional construction is disadvantageous in that one of the terminal ends of the radiator 16 is not secured fixedly by the bolt with the result that when the radiator 16 is attached or fitted to the case bracket the terminal end movably or rotatably engaged with the bolt 13' tends to be distorted to exert a residual stress on diode chips embedded in the radiator 16 in the direction indicated by arrow in FIG. 5. This would cause loss of the diode chips, breakage of lead wires from the diode chips, peeling of solder used for fixing the diode chips or the like troubles. In this respect, too, further improvement in the structure of rectifiers is desired.

Moreover, the conventional rectifiers include radiators provided with diode chips and an insulating substrate opposing or facing the radiators, the insulating substrate having provided therewith a plurality of terminal boards, each of which is connected to a terminal or foot extending from the corresponding diode chip and a lead wire from a stator coil. Since the terminal board is composed of a single plate onto which the terminal of the diode chip and the lead wire from the stator coil are connected at the same position heat applied upon connecting or external stress exerted from the side of the stator coil tend to be transmitted through the single terminal board to the diode chip which is susceptible to such heat and stress. This also causes various inconveniences described above and thus ultimately deteriorates the reliability of the rectifier.

SUMMARY OF THE INVENTION

An object of the present invention is to provide a rectifier which can obviate the above defects of the conventional rectifiers.

Another object of the present invention is to provide a rectifier which has a highly reliable performance.

Still another object of the present invention is to provide a rectifier which enables efficient cooling.

Yet another object of the present invention is to provide a rectifier which is less susceptible to troubles caused by heat or residual stress.

As a result of extensive research, it has now been found that the above objects can be achieved by providing a split type radiator, i.e., a pair of radiators and placing them in air pathway in which air for cooling the radiators is introduced in a specified arrangement or relation.

The present invention is based on the above discovery and provides a rectifier in alternating current generators for automotive vehicles comprising a pair of conductive radiators for positive and negative sides, each having embedded therein diode chips arranged in a juxtaposed fashion, an insulating substrate facing the radiators and equipped with a terminal strip to be connected with each of lead wires from corresponding diode chips, and cooling fins provided on the radiator, wherein said radiators are placed in the radial direction in parallel relation with respect to each other in air pathway, in which air for cooling the radiators is introduced in the inside of the generator through air intake ports provided on a case bracket of the generator by the action of a cooling fan.

DESCRIPTION OF PREFERRED EMBODIMENTS

Figure 5:
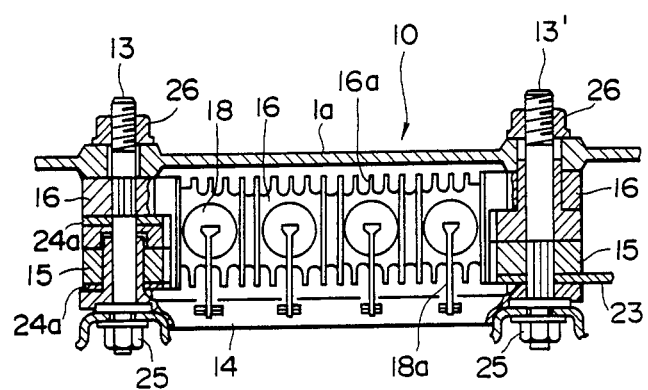
FIG. 5 is a cross-sectional side view of the important part of the rectifier shown in FIG. 2.
Figure 6:
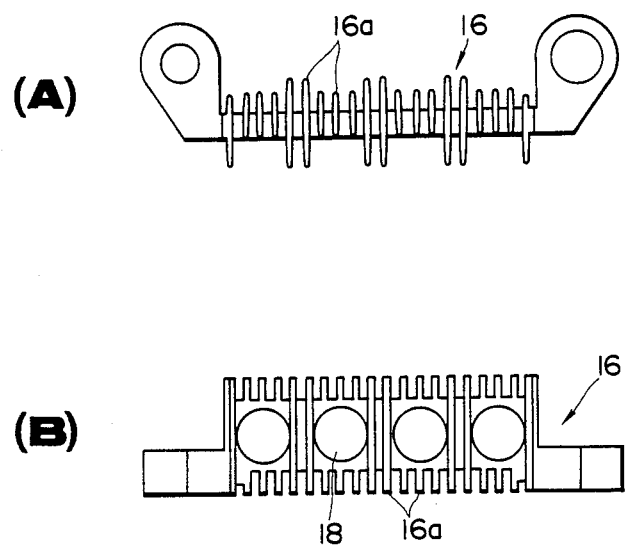
FIGS. 6A and 6B are a front elevational view and a side view, respectively, of the negative-side radiator in the rectifier of the present invention.

In FIG. 1 to 4, reference numeral 1 is an alternating current generator for automotive vehicles such as cars and the like. The generator 1 comprises a pair of case brackets 1a and 1b supporting a rotary shaft or core shaft 2 having fixed thereto as by force fitting a Lundell type rotor core 3, which has secured onto one end thereof a pulley 4 and which has incorporated therein a coil bobbin 5 having wound therearound a rotor coil 6, a stator 7 having wound therearound a stator coil 7a, a plurality of brushes 8 supported or accommodated elastically or resiliently as by springs through a brush holder 8a, a plurality of slip rings 9 being in slidable contact with the brushes, a rectifier 10 for rectifying generated alternating current. The parts or members except the rectifier 10 may be constructed in the conventional manner. The rectifier 10 is fitted or fastened to a side plate 11, which is an annular plate provided on the side surface of the rotor core 3, together with the brush holder 8a, a regulator 12 and various other members, if desired, by a plurality of bolts 13'. The rectifier 10 is placed in air pathway in which air for cooling the radiators is introduced into the inside of the generator 1 from the outside of the generator 1 through air intake ports (not shown) formed in the case brackets 1a and 1b. Air flow is generated and advanced in the air pathway in the direction along the axis of the rotor core 3 by the action of a cooling fan 3a which is unitarily or solidly provided on the rotor core 3. The air thus introduced flows in a swirling fashion in the cooling fan 3a, cools the stator coil 7a and is expelled or discharged from the generator through air outlet ports (not shown) formed in the case brackets 1a and 1b. The rectifier 10 comprises an insulating material or substrate 14 opposing or facing a pair of radiators 15 and 16 which are attached, together with the substrate 14, to the case bracket through, e.g., two bolts 13 and 13'. The radiators 15 and 16, are positive-side and negative-side radiators, respectively, and arranged in superposed relation one over another. Both ends of each radiator 15 or 16 are engaged with the bolts 13 and 13', respectively, with the radiators 15 and 16 being insulated from each other by an appropriate means, e.g., an insulator 17 interposed therebetween. Although the engagement of the radiators 15 and 16 may be of a conventional type as shown in FIG. 5 it is preferred that the radiators 15 and 16 be assembled by bolts 13, 13' in accordance with an embodiment of the present invention described hereinafter. The positive-side radiator 15 is placed closer to the axis of the rotor core 3, and the negative-side radiator 16 is positioned radially outward of or on the outer side of radiator 15, i.e., on the side more remote than the radiator 15 from the axis of the core shaft 2. The radiators 15 and 16 are arranged in parallel relation to each other, and they are positioned parallel to the direction of the air pathway or air flow such that the insulating substrate 14 is positioned downstream of the air course. The radiators 15 and 16 are provided with respective cooling fins 15a and 16a projecting therefrom.

The radiators 15 and 16 have embedded therein diode chips on the respective outer surface sides thereof at portions designated by reference numeral 18. The diode chips are arranged in a row on the radiators and lead wires 18a extending from the respective diodes are connected to corresponding terminal boards 20 and 21 to which lead wires 7b from the stator coil 7a are connected, thus forming a basic circuit of the generator.

In FIGS. 2 to 5, reference numeral 24 designates a member in which a condenser for preventing the occurrence of noise is incorporated, and terminal boards 24a extending from the member 24 are interposed between the insulating substrate 14 and the positive-side radiator 15, and between the insulator 17 and the negative-side radiator 16, respectively, and fitted to one end of the insulating substrate 14 by the bolt 13.

In operation, current is passed through the brush 8 and the slip ring 9 to the rotor core 3, which is rotated by the pulley 4 and rotary shaft 2 to induce alternating current in the stator coil 7a and the current is rectified by the rectifier 10. The voltage output is regulated by the regulator 12. This process of operation is known and detailed description thereof will be omitted. Rotation of the rotary shaft 2 causes the cooling fan 3a to rotate, to cause current of cold fluid or air flow to pass through the air inlet ports formed in the case brackets 1a and to 1b and cool the stator coil 7a and the cooling fins 15a and 16a.

Figure 1:
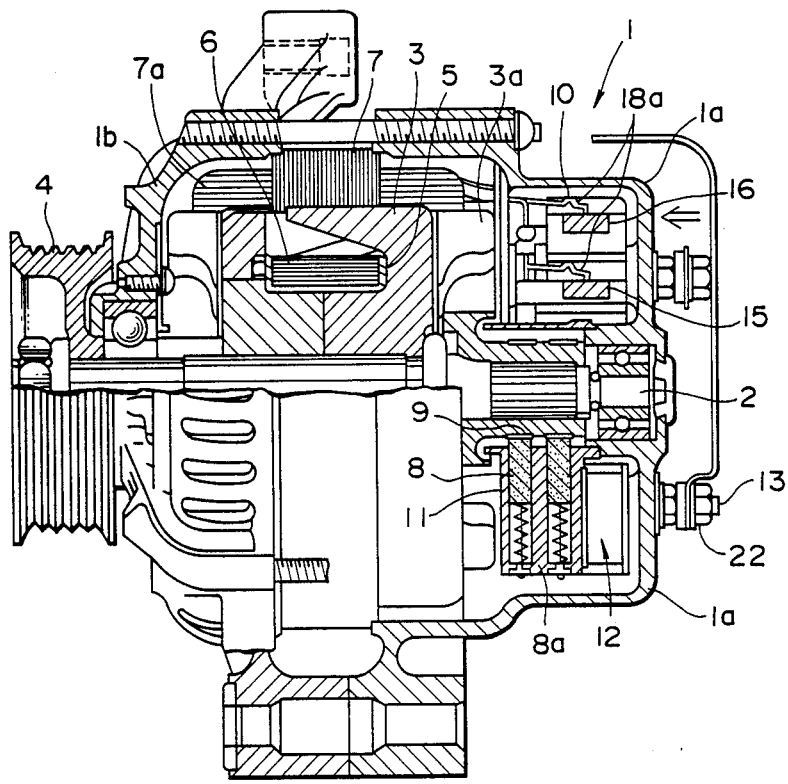
FIG. 1 is a partially cutaway side view of an alternating current generator for use in vehicles comprising the rectifier device of the present invention.
Figure 2:
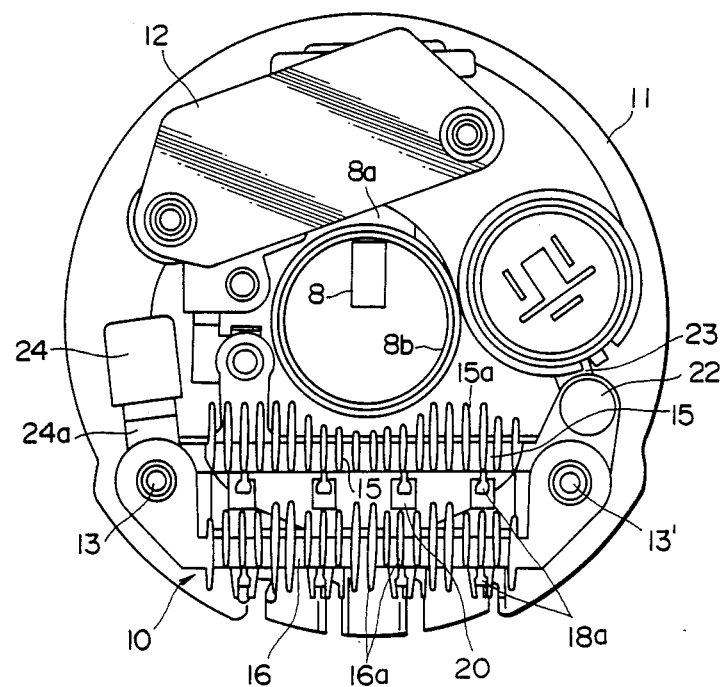
FIG. 2 is a front elevational view of the rectifier according to one embodiment of the present invention attached to the side plate of the generator.
Figure 3:
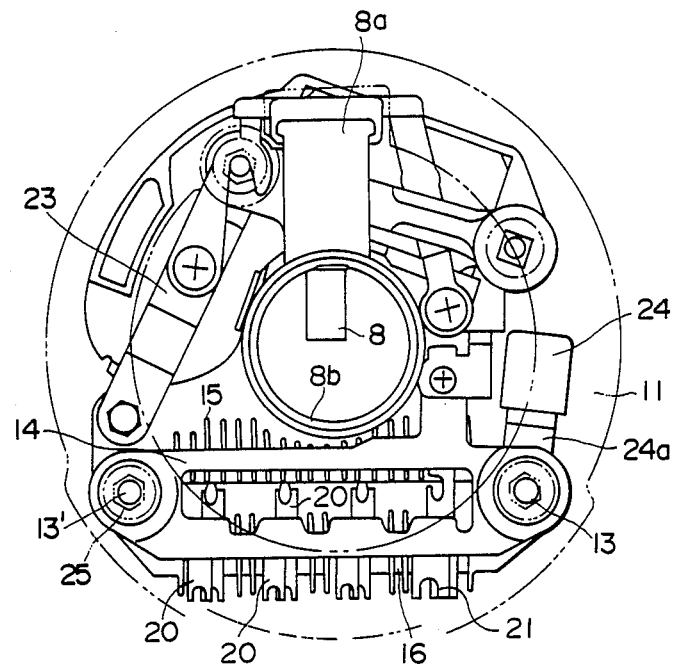
FIG. 3 is a rear elevational view of the rectifier shown in FIG. 2.
Figure 4:
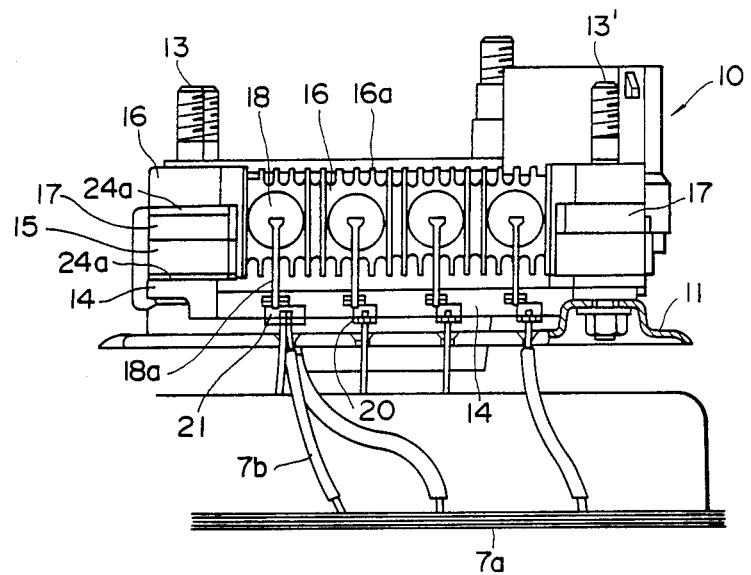
FIG. 4 is a side view of the rectifier shown in FIG. 2.
Figure 7:
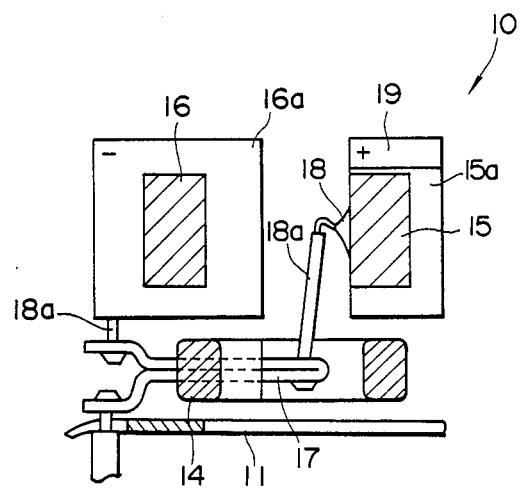
FIG. 7 is a cross-sectional view of the important part of the rectifier of the present invention illustrating the function thereof.

According to a preferred embodiment of the present invention, the cooling fins 15a and 16a project in at least three directions (FIGS. 2 to 7). More particularly, the negative-side radiator 16 has a plurality of cooling fins 16a, which projects from four surfaces of the radiator 16, that is, on the front and rear surfaces of the radiator 16 seen in the direction along the axis of the core shaft 2 (or along the air pathway) and on the inner and outer surfaces of the radiator 16 seen from the side of the core shaft (the side surface of the radiator 16 facing the radiator 15 is the inner surface of the radiator 16). The cooling fins 16a are arranged in a space-apart relation from each other on the front and rear surfaces and on the inner surface. However, on the outer surface, the cooling fins 16a are disposed in areas excluding the portions where diode chips are embedded (FIG. 6B). On the other hand, the arrangement of a plurality fins 15a on the positive-side radiator 15 is substantially the same as that of the cooling fins 16a on the radiator 16 except that the radiator 15 has no cooling fin on the outer surface i.e., the surface facing the negative-side radiator, of the radiator 16. Thus, the radiator 15 has cooling fins 15a on the front and rear surfaces and on the inner surface thereof. However, some of the cooling fins 15a on the inner surface of the radiator 15 are cut away such that the ends of the fins facing the cover 8b, which is solidly attached to the brush holder 8a and surrounds the slip ring 9, are arranged along an imaginary curvature which is concentric with the periphery of the cover 8b in a space-apart relation with a predetermined distance therefrom so as to avoid the contact with the cover 8b (FIGS. 2 and 3). The portions of the cooling fins 15a on the front surface or upstream-side surface of the radiator 15 may preferably be provided with an insulating coating 19 so that insulation of the fins 15a from the case bracket 1a can be secured (FIG. 7).

Provision of long-span cooling fins extending on the inner surface of the positive-side radiator 15 and of those on the inner and outer surfaces of the negative-side radiator 16 improves the cooling characteristics or efficiency of the rectifier 10 since the long-span fins can directly receive cooling air and therefore cooling can take place on large surface area. When the engine of the automotive vehicle rotates at low speed weak air flow occurs or the amount of air flow is small. In this situation, particularly the cooling fins 15a and 16a projecting toward the cooling fan 3a operate effectively to cool the radiators 15 and 16. On the other hand, high speed rotation of the engine brings about strong air flow; contribution to the cooling of the radiators is made largely by the long-span cooling fins, which have large surface areas. Therefore, cooling performance of the rectifier can be optimized corresponding to the given air flow rate which may vary depending on the rotational speed of the engine of the automotive vehicle.

The above construction is advantageous because although air flow toward the radiator 16 is partly obstructed by the side plate 11 the reduction in the cooling efficiency can be compensated by the increase afforded by the provision of the cooling fins 16a on the outer side surface of the radiator 16, thus assuring the maintenance of high cooling efficiency. Further, the insulating coating 19 provided on the portion, upstream of the air course, of the positive-side radiator 15 keeps or enhance the dielectric resistance between the radiator 15 and the case bracket 1a, which is negative side. Even when salts or dusts accumulate on and between the radiator 15 and the case bracket 1a these members can be prevented from short-circuiting as well as from suffering galvanic corrosion, which also adds to improvement in the reliability of the rectifier 10.

Referring to FIGS. 8A to 11, another preferred embodiment of the rectifier according to the present invention will be explained hereinbelow. In this embodiment the insulating substrate 14 is composed of integral parts, namely, cylindrical guides, support portions 14b and a pair of frame members 14a, 14c and 14d. The cylindrical guides 14a, in which the bolts 13' are loosely or movably inserted, are formed integrally with the support portions 14b having respective recesses where collars 13a of the bolts 13 are applied or fitted to support the insulating substrate 14, and the frame members 14c and 14d are formed between the support portions 14b so as to face the radiators 15 and 16, respectively. The frame member 14d facing the negative-side radiator 16 is provided with terminal boards 20 and 21 to which the ends of lead wires from the diode chips embedded in the radiators 15 and 16 are connected.

Figure 8A:
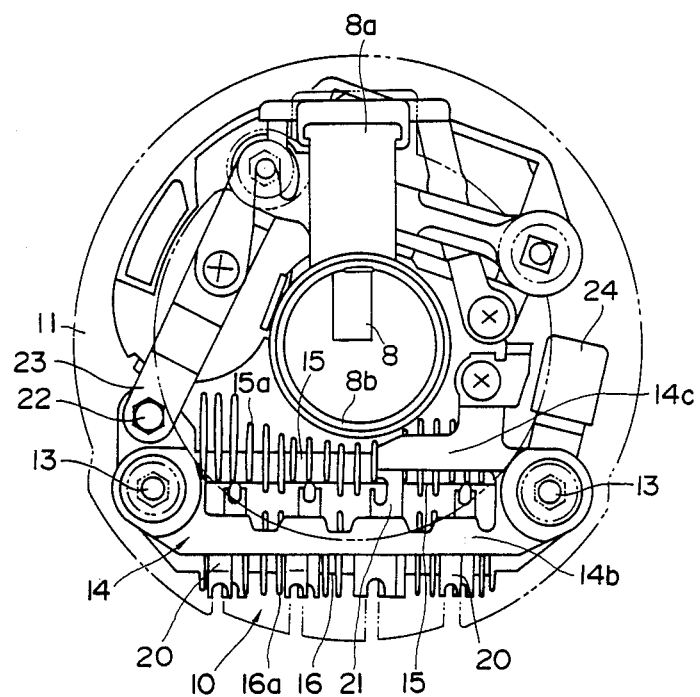
FIG. 8A is a rear elevational view of a rectifier according to a preferred embodiment of the present invention.
Figure 8B:
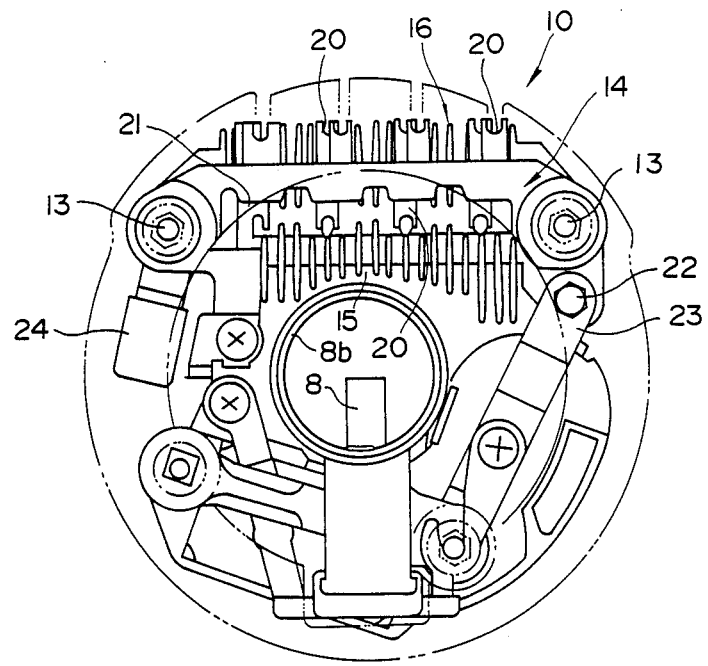
FIG. 8B is a rear elevational view of a rectifier according to another embodiment of the present invention.
Figure 10A:
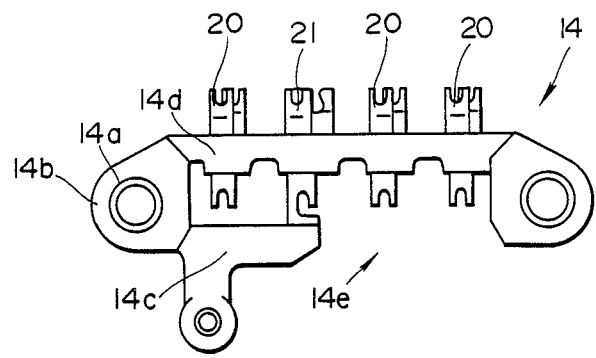
FIG. 10A is an enlarged rear elevational view of the important part of the rectifier shown in FIG. 8A.
Figure 10B:
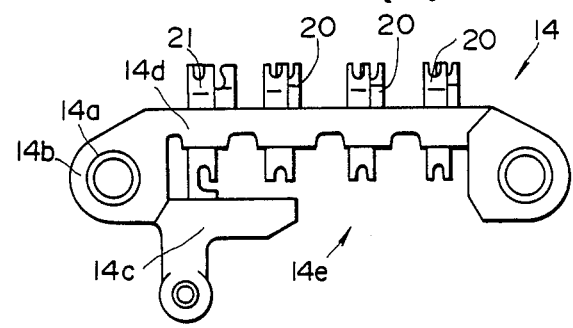
FIG. 10B is an enlarged rear elevational view of the important part of the rectifier shown in FIG. 8B.

In a variation shown in FIG. 8A and FIG. 10A, three terminal boards 20 for normal diode chips and one terminal board 21 for neutral point diode chip are used. The terminal board 21 for neutral point diode is positioned inside, sandwiched by terminal boards 20, 20. Thus, the heat generation or releasing areas of the radiators 15 and 16 are each separated into two regions by the terminal board 21. Since the neutral point diodes undergo low input and generate a smaller quantity of heat the terminal board for the neutral point diode releases a smaller quantity of heat than the terminal board for normal diodes and none of the normal type terminal boards 20 is directly sandwiched by other normal type terminal boards this construction enables efficient cooling of the radiators. Further, the frame member 14c facing the positive-side radiator 15 is smaller than the frame member 14d because it lacks a portion facing the region occupied by terminal boards 20, 20 to form an open space 14e (FIG. 10A).

Figure 9:
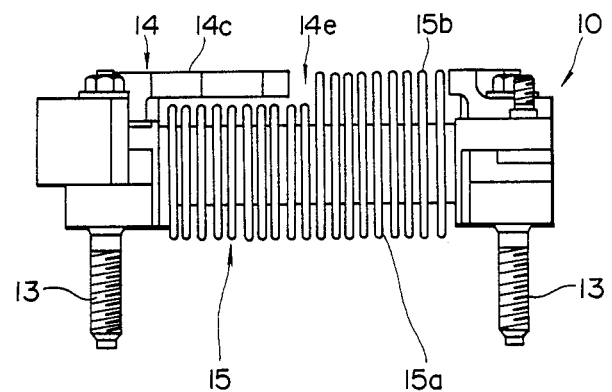
FIG. 9 is a side view of the rectifier shown in FIG. 8A.

Preferably, the cooling fins 15a extending from the surface of the radiator 15 facing the open space 14e may be replaced by longer cooling fins 15b so that the ends thereof can reach the open space 14e and be substantially in flush with the upper or read surface of the frame member 14c, as shown in FIG. 9. Use of the cooling fins 15b, which have a larger surface area, further improves the cooling efficiency of the radiators 15. It is preferred to use the radiators 15 and 16 which have cooling fins projecting in at least three directions as shown in FIGS. 2 to 7 although the distribution and arrangement of the cooling fins 16a (15b) and 15a on the radiators 15 and 16 are not limited to those shown in FIGS. 2 to 7.

Figure 11:
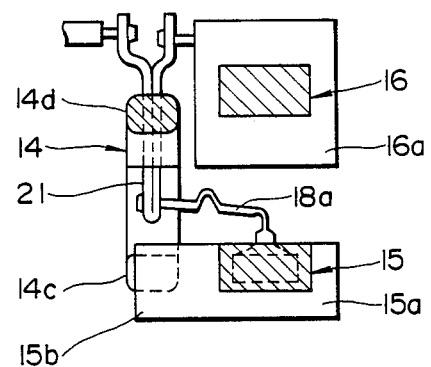
FIG. 11 is a cross-sectional view of the important part of the rectifier shown in FIG. 9.

In the embodiment shown in FIGS. 8A to 11, the arrangement and distribution of the cooling fins are substantially the same as those shown in FIGS. 2 to 7 except that some of the cooling fins 15a have extended portions 15b as shown in FIGS. 9 and 11. In this case, since those cooling fins 15a which have extended portions 15b face the region of the radiator 15 in which two high input diodes that generate a large quantity of heat are embedded the cooling efficiency of the region is improved and uniform cooling can be obtained.

EXAMPLE

Two types of the rectifiers of the present invention comprising cooling fins 15a with extended portions 15b (hereinafter referred to simply as "large cooling fins"), that is, one as shown in FIG. 10A in which the terminal board 21 for the neutral point diode chip was placed inside and another in which the terminal board 21 was on the outside side (FIG. 10B), were compared, in operation, with a rectifier which had the same arrangement of the diode chips as above but did not have open space 14e nor cooling fins with extended portions 15b (hereinafter referred to simply as "small cooling fins"). The results obtained are shown in Tables 1 and 2 below, in which character A designated a neutral point diode chip and characters B, C and D designate normal diode chips.

TABLE 1

| Arrangement of Diode Chips | Distribution of Temperature | | | | | | | |
|---|---|---|---|---|---|---|---|---|
| | (+)-Side Radiator (°C.) | | | | (−)-Side Radiator (°C.) | | | |
| | B | A | C | D | B | A | C | D |
| Shape of Fin: | | | | | | | | |
| Small | 89 | 93 | 106 | 102 | 83 | 88 | 96 | 92 |
| Large | 84 | 88 | 99 | 96 | — | — | — | — |

TABLE 2

| Arrangement of Diode Chips | Distribution of Temperature | | | | | | | |
|---|---|---|---|---|---|---|---|---|
| | (+)-Side Radiator (°C.) | | | | (−)-Side Radiator (°C.) | | | |
| | A | B | C | D | A | B | C | D |
| Shape of Fin: | | | | | | | | |
| Small | 77 | 102 | 113 | 106 | 74 | 94 | 102 | 95 |
| Large | 75 | 98 | 109 | 99 | — | — | — | — |

From the results shown in Tables 1 and 2 above, it can be seen that the provision of the open space 14e and cooling fins 15a having extended portions 15b improved the cooling efficiency of the radiators and gave rise to more uniform temperature distribution.

It is also evident from the results shown in Tables 1 and 2 that the arrangement of the neutral point diode chip inside greatly improved the cooling characteristics of the radiators and that the arrangement in which the neutral point diode chip was positioned outside when accompanied by the provision of cooling fins with extended portions was also effective though to a lesser extent.

Figure 12:
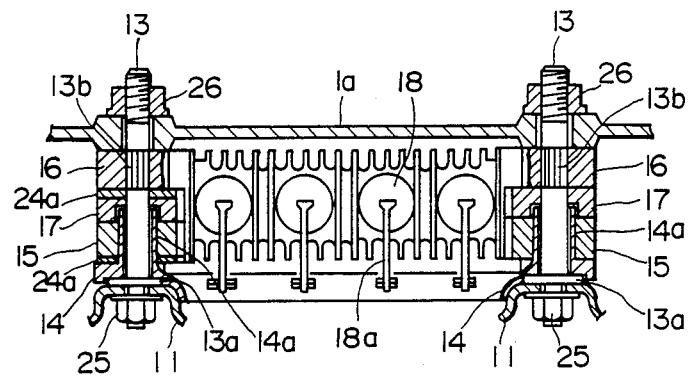
FIG. 12 is a partial cross-sectional side view of the rectifier according to a further preferred embodiment of the present invention illustrating the engagement of radiators and an insulating substrate.

In a further preferred embodiment of the present invention of which the important part is as shown in FIG. 12, the bolts 13 are loosely or movably inserted in the insulating substrate 14 having respective recesses on the lower surface thereof where collars 13a of the bolts 13 unitarily formed therein are applied or fitted to support the insulating substrate 14 near one end thereof. On the upper surface of the insulating substrate 14 are unitarily provided projecting therefrom cylindrical guides 14a in which the bolts 13 are inserted. Both ends of the positive-side radiator are engaged with the guides 14a such that the ends of the radiator 15 are attached to the bolts 13 in the midway thereof in an insulated relation. An insulator 17 having a hole through which the bolt 13 is inserted and an annular recessed portion against which the top of the projected cylindrical guide 14a butts is provided so that the lower side of the insulator 17 is on the upper side of the radiator 15. The upper side of the insulator 17 is in contact with one end of the negative-side radiator 16 which is solidly attached as by force fitting to the bolt 13 through a serration 13b formed near the tip portion of the bolt 13. Other parts may be constructed in the same manner as the other embodiment described herein. A terminal pin 22 is force-fitted to one of the ends of the positive-side radiator 15 through a serration portion (not shown) and one end of a terminal bar 23 is force-fitted to the serration portion (FIG. 2). In FIG. 12, a member (not shown) in which a condenser for preventing the occurrence of noises is incorporated, has terminals 24a extending therefrom which are inserted between the insulating substrate 14 and the positive-side radiator 15, and between the insulator 17 and the negative-side radiator 16, respectively, on one end of the insulating substrate 14. The radiators 15 and 16 are insulated from each other through the cylindrical guide 14a and the insulator 17.

The rectifier thus constructed is tightly fastened, on one hand, to the side plate 11 with nuts 25 on the bottomside of the bolt 13 and, on the other hand, to the case bracket 1a with nuts 26 on the tip side of the bolt 13.

In the rectifier according to the above embodiment, the positive-side radiator 15 engaged with the bolts 13 at the both ends thereof in insulated relation is clamped by the insulating substrate 14 and the negative-side radiator 16, which is solidly force-fitted to the bolts 13 at the both ends thereof through the serration portion 13b. This construction results in a rigid connection of negative-side radiation 16 with the bolts. Thus, when the rectifier 10 is assembled to the case bracket 1a a possibility which would otherwise occur that the negative-side radiator is distorted, which exerts a residual stress on the negative-side radiator 16 and thus breaks the diode chips embedded therein, can be avoided effectively, thus giving rise to a rectifier having improved reliability.

Further, in the rectifier according to this embodiment, the positive-side radiator 15 and the terminal bar 23 are connected in serration contact through the terminal pin 22 in contrast to connection through the bolt 13; the connection between the radiator 15 and the bar 23 is ensured. The bolts 13 each is connected to the negative-side, which is earthed, there is no need to secure insulation between the case bracket 1a and the bolt 13 when the rectifier is attached to the case bracket 1a, unlike the case where the positive-side radiator 15 is force-fitted to the bolts 13, thus enabling the simplification of the construction.

Figure 14:
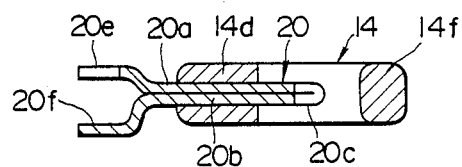
FIGS. 14X and 14Y are cross-sectional views along the lines X—X and Y—Y, respectively, in FIG. 13A.
Figure 14:
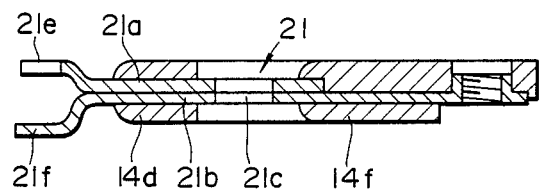
Figure 13A:
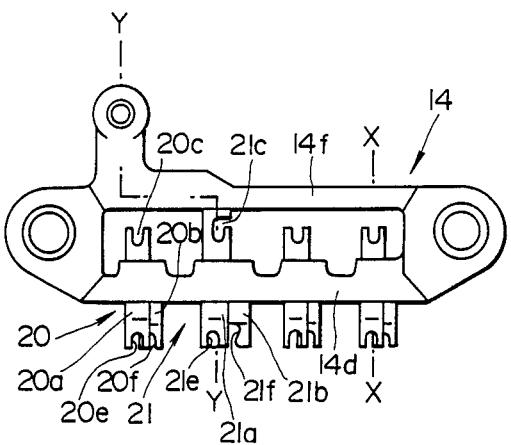
FIGS. 13A, 13B and 13C are a front elevational view, a rear elevational view and a side view, respectively, of the important part of the rectifier according to another preferred embodiment of the present invention.
Figure 13B:
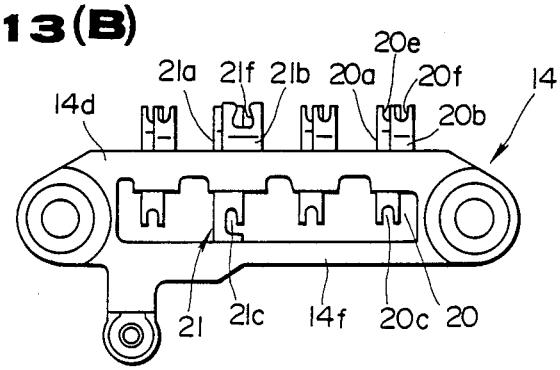
Figure 13C:
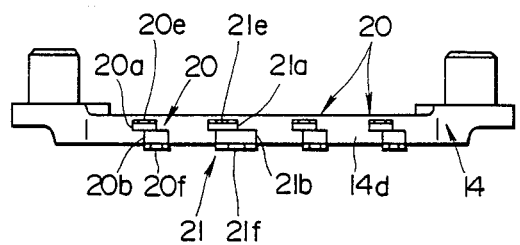

Referring to FIGS. 13A and 14A, another preferred embodiment of the rectifier of the present invention is described in detail hereinbelow. In this embodiment, the terminal board 21 for the neutral point diode chip is composed of a pair of plate members 21a and 21b superposed one over another. The exposed portion of the terminal board 21 sandwiched by the frame members 14f and 14d is provided with a recess 21c which is adapted to engage and connect with a lead wire 18a extending from the diode chip embedded in the positive-side radiator 15. On the other hand, the portion of the terminal board 21 protruding from the frame member 14d facing the negative-side radiator 16 is composed of the plate members 21a and 21b formed by bending metal plates so that they are apart from each other upward and downward as viewed in FIG. 14Y, that is, to the side of the negative-side radiator 16 and the side of the stator coil 7a. The upper plate member 21a is provided with a recess 21e for allowing engagement and connection with the terminal lead wire 18a of the diode chip embedded in the negative-side radiator 16. On the other hand, the lower plate member 21b is formed with a recess 21f in which the lead wire 7b from the stator coil 7a (or stator coil 7a itself) is inserted for engagement and connection. Preferably, the recesses 21e and 21f may be biassed or deviated in the direction along the length of the frame member 14d. The recess 21f for engagement and connection formed in the lower plate member 21b is substantially of a shape of a relatively large triangle, which facilitates engagement of three lead wire 7b with the plate member 21b and prevents the lead wires 7b from coming off from the recess 21f upon caulking. The lower plate member 21b extends through the frame member 14f facing the positive-side radiator 15 as shown in FIG. 14Y.

On the other hand, other terminal boards 20 are composed of two plate members, i.e., upper and lower plate members 20a and 20b, respectively, formed by bending a metal plate in the midway. On one of the end portions of each terminal plate 20 which is between the frame members 14d and 14b is provided with a recess 20c for engagement and connection with the lead wire 18a from the diode chip embdded in the positive-side radiator 15. On the other hand, the end portion of each terminal board 20 protruding outwardly from the frame member 14d facing the negative-side radiator 16, as in the case of the terminal board 21, is composed of plate members 20a and 20b formed by bending a metal plate in the midway so that they are arranged in a psace-apart relation from each other upward and downward, that is, to the side of the negative-side radiator 16 and the side of the stator coil 7a, as shown in FIG. 14X. The upper plate member 20a is provided with a recess 20e for allowing engagement and connection with the lead wire 18a of the diode chip embedded in the negative-side radiator 16. On the other hand, the lower plate member 20b is formed with a recess 20f with which the lead wire 7b from the stator coil 7a (or stator coil 7a itself) is engaged for connection. Preferably, the recesses 20e and 20f may be biassed or deviated from each other in the direction along the length of the frame member 14d.

In the above construction, the terminal boards 20 and 21 attached to the insulating substrate 14 have the respective upper and lower plate members separated from each other to which the lead wire 7b from the stator coil 7a and the lead wire 18a communicated to the diode chip, respectively, are connected, and therefore, heat applied upon the formation of connections and the residual stress from the stator coil 7a can be effectively prevented from directly affecting the diode chips. Upon forming connections the lead wire 18a on the side of the diode chips are engaged with the recesses 20e and 21e formed in the upper plate members 20a and 21a while the lead wires 7b from the stator coil 7a are engaged with the recesses 20f and 21f formed in the lower plate members 20b and 21b, and these recesses are aculked to temporarily fasten them followed by finally connecting as by soldering. Since the lead wire 7b is relatively thick a considerably large quantity of heat is requried to connect it to the terminal board. However, separation of plate members upward and downward enables avoiding direct influence of heat applied upon the formation of connections and residual stress exerted from the stator coil 7a on the diode chips through the lead wire boards 18a. Therefore, the diode chips susceptible to heat and external stress can be protected effectively, thus rendering the rectifier 10 obtained highly reliable.

Since the diode chips are delicate great care must be taken when attaching them to the radiators 15 and 16; at first, the lead wire 18a of the diode chips may preliminarily be connected to the plate members 20a and 21a to form assembler units or indentators followed by assembling the indentators to the generator 1 as is usually done in the art.

Further, the biassed arrangement of the recesses 20e and 20f formed in the upper and lower plate members 20a and 20b or of the recesses 21e and 21f formed in the upper and lower plate members 21a and 21b in the direction along the length of the frame member 14d facilitates the operation of forming connections with the lead wire 7b or 18a. The arrangement is also advantageous in that inconveniences such as unintended contact of a soldering iron with the upper plate member 20a or 21a when connecting the lead wire 7b with the lower plate member 20b or 21b can be avoided.

Furthermore, in spite of the fact that the terminal boards 20 are of the shape such that a single metal plate is bent in the midway so as to form superposed upper and lower plate members there is no increase in the number of parts used.

While the invention has been described with reference to preferred embodiment it is to be understood that various modifications and variations may be made therein without departing from the spirit or scope of the following claims.

What is claimed is:

1. An alternating current generator for automotive vehicles comprising:
   a pair of opposed case brackets,
   a core shaft rotatably supported between the case brackets,
   a rotor core fitted to the core shaft,
   a rotor coil wound over the rotor core to form a rotor disposed between the case brackets, the rotor being rotatable about the axis of the core shaft,
   stator means, surrounding the rotor, for having an alternating current induced therein by the rotational movement of the rotor,
   rectifier means for rectifying alternating current induced in the stator, the rectifier means being secured to one of the case brackets so as to be disposed between the rotor and said one of the case brackets, and
   a cooling fan provided on the rotor core, the cooling fan generating, in the generator, an air flow in a direction substantially along the axis of the core shaft so as to cool the rectifier means when the rotor is rotated,
   said rectifier means comprising a pair of substantially elongated opposed conductive radiators for positive and negative sides respectively, each having embedded therein diode chips arranged in a juxtaposed fashion, said radiators extending in a direction substantially perpendicular to the axis of the core shaft, and being radially spaced from each other to form an air pathway therebetween into which the air flow is introduced, whereby substantial surface area for heat transfer is ensured on mutually opposing surfaces of the radiators.

2. An alternating current generator as claimed in claim 1, wherein the rectifier means further comprises and insulating substrate disposed between the rotor and the radiators, the insulating substrate being equipped with terminal boards through which the stator is electrically connected to the diode chips in the radiators, the insulating substrate comprising a pair of outer and inner frame members facing and extending substantially parallel to the radiators, the outer frame member being positioned further from the core shaft than the inner frame member, the frame members being radially spaced from each other so that space directly in communication with the air pathway is defined between the frame members.

3. An alternating current generator as claimed in claim 2, wherein the radiator for the negative side is positioned further from the core shaft then the radiator for the positive side, the negative-side radiator having first cooling fins extending into the air course, the positive-side radiator having second cooling fins extending away from the negative-side radiator.

4. An alternating current generator as claimed in claim 3, wherein the terminal boards are mounted on the outer frame member of the insulating substrate, each of the terminal boards including inner and outer portions, the inner portion projecting toward the inner frame member so as to be disposed within the space between the frame members, the outer portion projecting away from the inner frame member, wherein the inner portions of the terminal boards are electrically connected to the diode chips in the positive-side radiator through a first set of lead wires so that the first set of lead wires are disposed in both the space and the air pathway, and wherein the outer portions of the terminal boards are electrically connected to the diode chips in the negative-side radiator through a second set of lead wires.

5. An alternating current generator as claimed in claim 4, wherein each of the radiators include outer, inner, front and rear surfaces, the outer surface being disposed further from the axis of the core shaft than the inner surface, the front surface opposing said one of the case brackets, the rear surface opposing the insulating substrate, wherein the first and second cooling fins are formed on the respective inner surfaces of the radiators, and wherein each of the radiators further has cooling fins projecting from the front and rear surfaces thereof.

6. An alternating current generator as claimed in claim 5, wherein cooling fins are provided on the front surface of the positive-side radiator and have insulating coatings thereon in areas facing the case bracket to which the rectifier means is secured.

7. An alternating current generator as claimed in claim 5, wherein the rectifier means is secured to one of the case brackets by means of a pair of bolts, each of the bolts having a collar, wherein said insulating substrate further comprises: a pair of cylindrical guides in which the bolts are movably engaged, the cylindrical guides integrally formed respectively on opposite ends of the outer frame member; and support portions formed integrally with the cylindrical guides, said support portions having respective recesses where the collars of the bolts are fitted to support the insulating substrate.

8. An alternating current generator as claimed in claim 7, wherein said an inner frame member of the insulating substrate has a cutaway portion forming an open space.

9. An alternating current generator as claimed in claim 8, wherein the radiator for the negative side is positioned further from the core shaft than the radiator for the positive side, the positive-side radiator including: a rear surface opposing the inner frame member of the insulating substrate; and cooling fins extending from the rear surface of the positive-side radiator, wherein the inner frame member of the insulating substrate has a rear face facing the rotor, and wherein said cooling fins have extended portions directed into the open space, said extended portions being substantially flush with the rear face of the inner frame member of the insulating substrate facing the positive side radiator.

10. An alternating current generator as claimed in claim 2, wherein one of said diode chips in each of the radiators is a neutral point diode, and wherein said diode chips are arranged in each of the radiators such that the neutral point diode is placed between the other diode chips.

11. An alternating current generator as claimed in claim 8, wherein one of said diode chips in each of the radiators is a neutral point diode, and wherein said diode chips are arranged in each of the radiators such that the neutral point diode is placed between the other diode chips.

12. An alternating current generator as claimed in claim 2, wherein said radiators and the insulating substrate are attached by a pair of bolts having respective collars supporting corresponding ends of the insulating substrate, both ends of the positive-side radiator and both ends of the negative-side radiator being arranged on the side of the collar and on the side of the top of the bolt opposite the collar, respectively, and engaged with the bolts such that the positive-side radiator is insulated from the bolts and the negative-side radiator is insulated from the positive-side radiator, the positive-side radiator being sandwiched between the negative-side radiator and the insulating substrate, said ends of the negative-side radiator being solidly engaged with the bolts.

13. An alternating current generator as claimed in claim 12, wherein said ends of the negative-side radiator and the bolts are in serration contact with each other.

14. An alternating current generator as claimed in claim 2, wherein said terminal board is provided, on one end thereof protruding outwardly from the frame member, with a pair of plate members superposed one over another in a space-apart relation having respective recesses, one for connection with lead wires from the stator and other for connection with lead wire extending from the diode chip embedded in the negative-side radiator, the other end of the terminal board positioned between the frame members of the insulating substrate being provided with a recess for connection with lead wire extending from the corresponding diode chip embedded in the positive-side radiator.

15. An alternating current generator as claimed in claim 14, wherein said plate members are biassed in the direction along the length of the frame member.

16. An alternating current generator is claimed in claim 14, wherein said recess provided in the plate member on said end positioned between the frame members of the insulating substrate is of a triangular shape.

* * * * *

UNITED STATES PATENT AND TRADEMARK OFFICE
CERTIFICATE OF CORRECTION

PATENT NO. : 4,841,182

DATED : June 20, 1989

INVENTOR(S) : Kiyoshi Tsuchiya et al

It is certified that error appears in the above-identified patent and that said Letters Patent is hereby corrected as shown below:

On the title page Item (75), "Inventors: "Kyoshi Tsuchiya" should read -- Kiyoshi Tsuchiya--.

Signed and Sealed this

Eighth Day of May, 1990

*Attest:*

HARRY F. MANBECK, JR.

*Attesting Officer*    *Commissioner of Patents and Trademarks*